United States Patent
Kurd et al.

(10) Patent No.: US 7,873,134 B2
(45) Date of Patent: Jan. 18, 2011

(54) CLOCK GENERATION SYSTEM

(75) Inventors: Nasser A. Kurd, Portland, OR (US); Ravindra B. Venigalla, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 938 days.

(21) Appl. No.: 11/553,104

(22) Filed: Oct. 26, 2006

(65) Prior Publication Data
US 2008/0101523 A1    May 1, 2008

(51) Int. Cl.
*H03D 3/24*    (2006.01)
(52) U.S. Cl. ..................................... 375/376
(58) Field of Classification Search ................ 375/354, 375/371, 373, 376, 211, 214, 215, 316, 322, 375/324, 326, 327; 331/1 A, 2, 14, 16–18, 331/25, 172, 173; 327/141, 146–150, 152, 327/155–159, 162, 291–296
See application file for complete search history.

(56) References Cited

U.S. PATENT DOCUMENTS

| | | | | |
|---|---|---|---|---|
| 5,787,135 | A * | 7/1998 | Clark | 375/376 |
| 6,266,779 | B1 | 7/2001 | Kurd | |
| 6,320,424 | B1 | 11/2001 | Kurd | |
| 6,611,175 | B2 * | 8/2003 | Heymann | 331/2 |
| 6,624,674 | B1 * | 9/2003 | Zhao | 327/156 |
| 6,670,833 | B2 | 12/2003 | Kurd | |
| 7,042,259 | B2 | 5/2006 | Kurd | |
| 7,282,966 | B2 | 10/2007 | Narendra | |
| 2006/0001494 | A1 * | 1/2006 | Garlepp et al. | 331/2 |

* cited by examiner

*Primary Examiner*—David C Payne
*Assistant Examiner*—Vineeta S Panwalkar
(74) *Attorney, Agent, or Firm*—Erik R. Nordstrom

(57) ABSTRACT

Disclosed herein are clock generator systems comprising first and second stage PLLs thereby allowing for both lower PLL bandwidth filtering and higher bandwidth response, in accordance with some embodiments. Other systems may be disclosed and/or described herein.

17 Claims, 4 Drawing Sheets

CLOCK GENERATION SYSTEM

BACKGROUND

Fast phase locked loop (PLL) lock times may be important, e.g., with integrated voltage regulator (VR) controllers and power management applications to provide for quick state transitions. In addition to fast PLL lock time, reduced clock jitter may also be desired since reduction of jitter is typically proportional to an increase in maximum attainable frequencies and input/output (I/O) transfer rates. Clock latency can be particularly problematic in multi-core systems having multiple clock domain crossings. Accordingly, improved clock generation solutions are desired.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
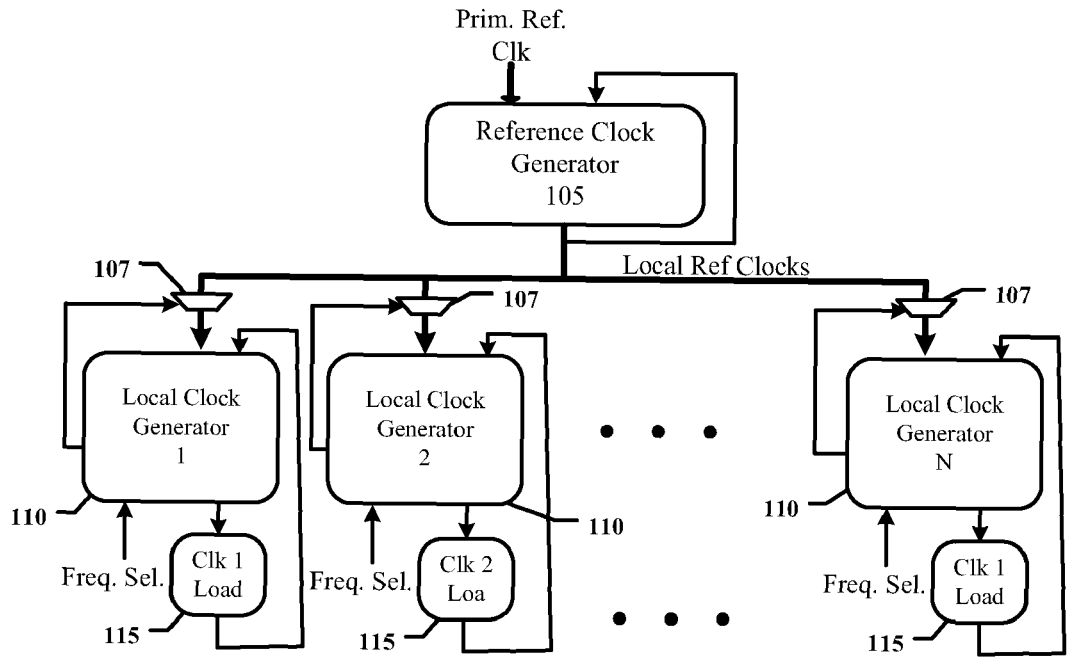
FIG. 1 is a diagram of a clock generation system in accordance with some embodiments.

FIG. 1 generally shows a clock generation system comprising a reference clock generator 105 coupled to N different local clock generators 110. Each local generator 110 is coupled to the reference clock generator 105 through an associated multiplexer 107 for selection of an available reference clock option.

The reference clock generator 105 receives as in input a primary reference clock signal (Prim. Ref. Clk) that may be provided from off-chip and thus may be relatively noisy and/or have high jitter. From the primary reference signal, the reference clock generator 105 generates one or more reference clocks to be provided to the local clock generators 110. In some embodiments, it generates two or more different reference clocks that are multiples of the primary reference clock. Through an associated multiplexer 107, each local clock generator can select a suitable one of these reference clock options.

In some embodiments, the reference clock generator 105 comprises a PLL with a relatively "clean" feedback path. As used herein, the term "clean feedback path" refers to a PLL feedback path that is relatively short, unloaded, and/or away from substantial noise-generating sources to provide a suitably accurate version of a PLL output clock back to its input. In some embodiments, the PLL may also have a relatively narrow PLL bandwidth (e.g., 4 MHz.) to filter jitter from the primary reference clock. This may be desired, especially in embodiments where the primary reference clock comes from an external or otherwise noisy or jittery source. (As used herein, "PLL bandwidth" is the measure of the PLL's ability to track the input clock and jitter. A high PLL bandwidth will typically provide fast lock time but will track jitter on the reference clock, passing it through to the PLL output. On the other hand, a PLL with low bandwidth is better for filtering out reference clock jitter but will typically have a slower lock time.)

A local clock generator 110 generates a clock signal off of a selected reference clock from the reference clock generator 105. The generated local clock drives an associated clock load 115, which may comprise one, a few, or multiple different devices to be clocked. The local clock generator 110 receives a frequency select (Freq. Sel.) signal to set the frequency to be generated by the local clock generator. In some embodiments, it may comprise a digital signal indicating a ratio of the desired output frequency to the primary reference frequency. For example, with a primary reference clock frequency of $F_{PR}$ (e.g., 133 MHz.), a frequency select value of 18 would result in a local clock frequency of $18F_{PR}$ (or approximately 2.4 GHz. with a primary frequency of 133 MHz).

In some embodiments, a local clock generator 110 may comprise a phase locked loop with relatively high PLL bandwidth, e.g., 4 to 5 times higher than the PLL bandwidth of the PLL used in the reference clock generator 105. This results in a relatively fast lock time for the output local clock. The overall clock generator comprising first and second stages (reference clk generator 105 and local clk generator 110) can then have the benefits of both high and low PLL bandwidth. That is, with its lower PLL bandwidth, the first stage (reference generator) can provide for good jitter rejection, while with its higher PLL bandwidth, the second stage (local generator) can provide good response resulting in faster lock times and reduced accumulated (long term) jitter error.

Figure 2:
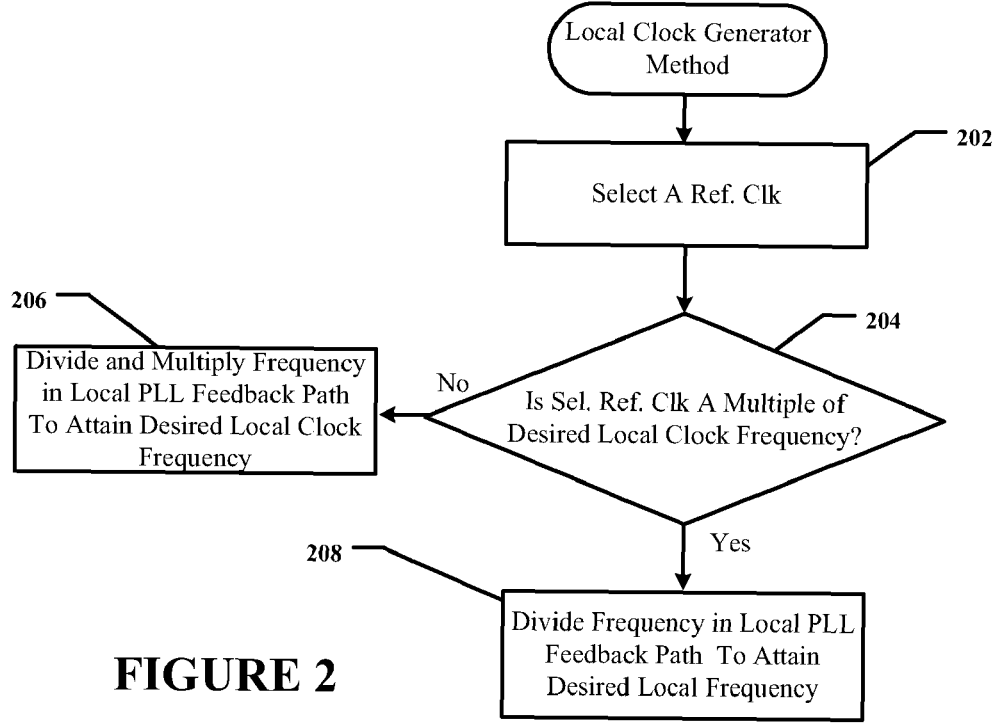
FIG. 2 is a flow diagram illustrating a method of generating a clock with the system of FIG. 1 in accordance with some embodiments.

FIG. 2 shows a routine for implementing a local clock generator 110 in accordance with some embodiments. At 202, a suitable ref. clk is selected from the available ref. clocks from reference clock generator 105. At 204, it determines if the selected reference frequency is a multiple of the desired local clock frequency. If it is a multiple, then at 208, in the feedback path of the local clock generator PLL, it divides the output local clock feedback to the PLL input by a suitable value (>1) to obtain the desired local clock frequency. (Note that this assumes that the reference clock frequency is smaller than the desired local clock frequency. If this is not the case, then the output itself could be divided, the feedback output could be multiplied by a suitable value (>1), or some other suitable operation could be implemented.) On the other hand, if the reference clock is not a multiple of the desired output local clock, then at 206, the feedback local clock is divided by a suitable value (>1) and multiplied by a suitable value (>1) to attain the desired local clock frequency.

This method provides a flexible approach for generating a variety of different local clock frequencies using one or more available reference clocks. In some embodiments, at step 202, the highest available reference clock may be selected to provide the local clock generator with better response. With more than one reference clock available, if this is not possible for a given desired output local clock frequency, then the next highest reference clock could be selected until one that enables the desired clock frequency to be attained is found.

Figure 3:
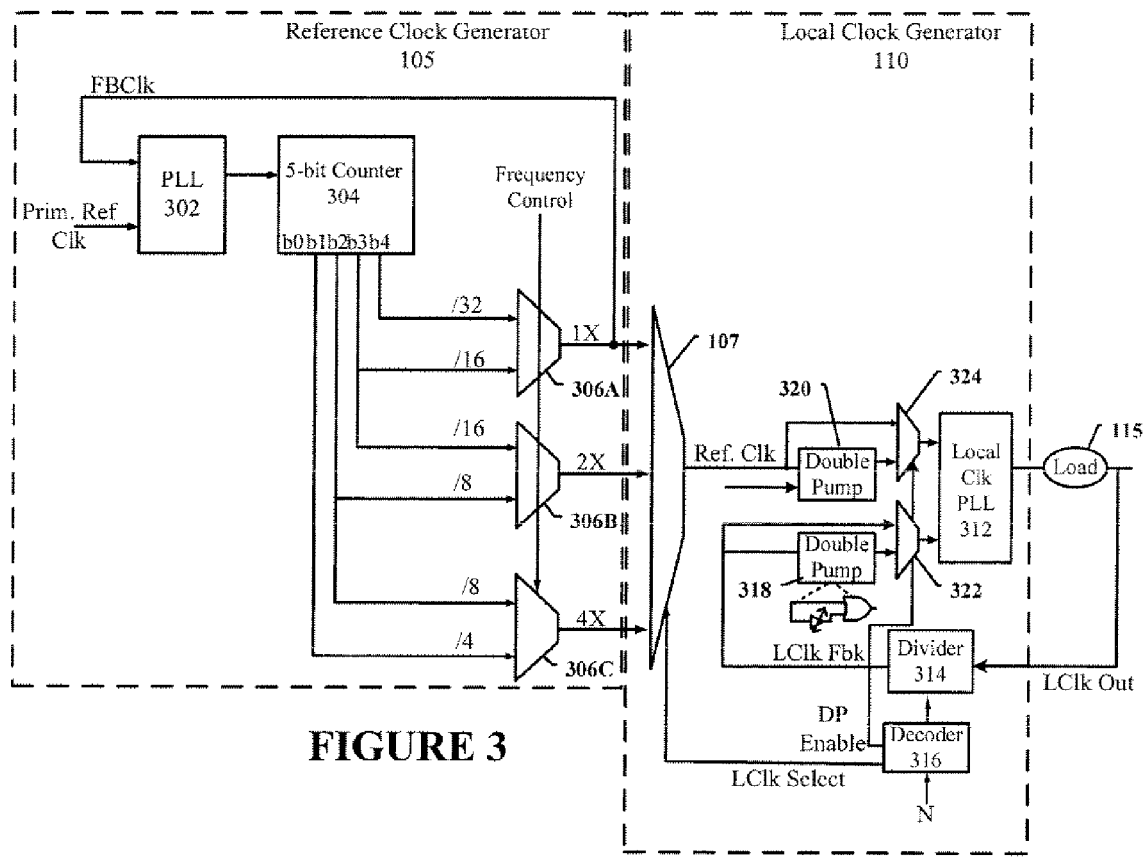
FIG. 3 is a diagram of a clock generator implementation of the clock generator of FIG. 1 in accordance with some embodiments.

FIG. 3 shows the clock generator of FIG. 1 in greater detail in accordance with some embodiments. In this figure, it comprises a reference clock generator 105 coupled to a single local clock generator 110 through multiplexer 107, to provide a local clock to a load 115. (For convenience only one local clock generator is shown.) The depicted reference clock generator 105 comprises a PLL 302, a 5-bit binary counter 304, and first, second, and third 2:1 multiplexer's 306A-C, all coupled together as shown. The PLL 302 receives at its inputs a primary reference clock (Prim. Ref. Clk) and a feedback clock (FBClk) tapped from the output of the first multiplexer 306A. The PLL 302 generates at its output a clock that tracks the feedback clock (FBClk) against the primary reference clock. In some embodiments, the PLL 302 has a relatively small PLL Bandwidth (e.g., about 4 MHz. for a primary reference clock of about 133 MHz.). With this relatively small bandwidth, PLL 302 can function to filter jitter (and possibly other noise) out of the primary reference clock.

The output clock from PLL 302 is provided to the counter 304 to drive (or clock) its count. Relative to the clock output from PLL 302, counter bits 4 and 3 provide divide by 32 and divide by 16 clocks, respectively. Likewise, bits 3 and 2 provide divide by 16 and divide by 8 clocks, respectively; and bits 2 and 1 provide divide by 8 and divide by 4 clocks, respectively. Inputs from the first multiplexer (306A) are coupled to its most significant bits, bits 4 and 3. In turn, the inputs from the second multiplexer 306B are coupled to bits 3 and 2, and the inputs from the third multiplexer 306C are coupled to bits 2 and 1. The multiplexer's are coupled to a common frequency control signal to control whether their first or second inputs are coupled through to their outputs. Thus, depending on the value of the frequency control signal, as illustrated in the figure, either divide by 32, divide by 16 and divide by 8 clocks will be provided at their outputs or divide by 16, divide by 8 and divide by 4 clocks will be provided at their outputs.

Since the feedback signal for PLL 302 is tapped from the output of the first multiplexer 306A, the output of multiplexer 306A is controlled to be at a frequency equal to the primary reference clock (Prim. Ref. Clk) frequency, which forces the PLL 302 to generate a clock with a frequency of 32 or 16 times that of the primary reference clock depending on whether the /32 or /16 signal is selected at multiplexer 306A. (Note that the nomenclature iX, where i is an integer, is intended to represent a frequency of i times the primary reference clock frequency.) Regardless of whether the frequency control signal selects the first or second sets of multiplexer input clocks, their outputs will be 1×, 2×, and 4×, as indicated. With this configuration, the frequency control signal selects the operating frequency (32× or 16×) for PLL 302 but doesn't affect the value of the clock frequencies provided at the multiplexer 306 outputs.

The PLL 302 is over-sampled, i.e., driven at a higher rate than a utilized clock derived from its output. In this case, the PLL is driven at 32× or 16×, while the provided output reference clock options are at 1×, 2×, and 4×. With over sampling, the PLL feedback ratio is made higher thereby increasing external reference clock jitter attenuation. With this in mind, it will normally be desirable to drive the PLL 302 at the higher frequency (32× in this embodiment). However, the two different drive options (32× and 16×) are provided in case the PLL, e.g., in a given fabrication lot, does not adequately operate at the higher frequency. For example, due to process, voltage, and/or temperature variations from chip to chip, it may be desirable to have one or more PLL frequency drive options available. The frequency control signal could be coupled to an on-board controller, for example, or coupled to a memory element such as a one-time or multi programmable cell such as a fuse cell, or some other type of non-volatile memory cell and programmed at the manufacturing stage or at start-up.

The depicted local clock generator 110 comprises a local clock PLL 312, a divider 314, a decoder 316, double-pump circuits 318, 320 and multiplexers 322, 324, all coupled together as shown. Multiplexer 324 selectably couples a reference clock (selected from multiplexer 107) either directly to a first input of the PLL 312 or through double pump circuit 320. Similarly, multiplexer 322 selectably couples a local clock feedback (LClk Fbk) signal from divider 314 either directly to a second input of PLL 312 or to it through double pump circuit 318. The double pump circuits function to double the frequency of the clocks passing through them.

The PLL output is coupled to clock load 115. A local clock output (LClk Out) signal, tapped from a suitable location in the clock load 115 (which may comprise a clock tree and/or network of devices to be clocked), is fedback to PLL 312 through the divider 314. (it should be appreciated that the generated local clock is present throughout the load, i.e., from the output of the PLL 312 to the end of the clock load 115 although it, of course, is not exactly the same in all locations. For convenience, the generated local clock will be deemed to be at the location from where the feedback path is tapped. A feedback signal could be tapped from a variety of locations within the clock load domain depending, for example, on desired performance for particular clocked elements within the clock load, although it will typically be tapped from near or at the end of the load. In some embodiments, more than one tap point may be used, e.g., for averaging or quality control purposes.)

The fedback local clock (LClk Out) is coupled to an input of the divider 314, which divides (and possibly multiplies) the clock before providing it back to the PLL 312. The decoder is coupled to the divider to control how much it divides and in some cases, multiplies, the local clock output in order to attain a desired frequency. The decoder is also coupled to multiplexers 107, 322 and 324. The decoder 316 receives a ratio value N identifying the ratio of the desired local clock frequency to the primary reference clock frequency. For example, if N is 22, then the desired local clock frequency is N times $F_{PR}$ or $22F_{PR}$. Based on this ratio value N provided to the decoder, it selects an appropriate reference clock through multiplexer 107 and determines whether or not the local clock feedback signal (LClk Fbk) from the divider should be passed through the double pump circuit 318 before coupling to the PLL 312. It then controls the divider to divide the local clock output by an appropriate amount and depending on the value of the ratio, N, it may also control the divider to multiply the clock in order to attain a desired result. For example, assume that the 4× reference clock is selected from multiplexer 107, and the value of N is 26 (indicating that the desired local clock is to be at $26F_{PR}$). To attain this frequency, the divider should divide the local clock output by 26/4 (or 6.5). However, depending on the configuration of the divider, it may not be possible to divide by a non-integer. The decoder could select 2× as the reference clock instead of 4×(26/2=13), but it may be desirable, e.g., for response purposes, to use a higher input reference. So, another way to achieve a 26× clock and still use the 4× reference is to divide the local output clock by 13 and multiply it by 2 resulting in an overall division of 6.5 to produce the 26× local clock. The same principle can be extended for other reference clock and local clock frequency combinations.

Figure 4:
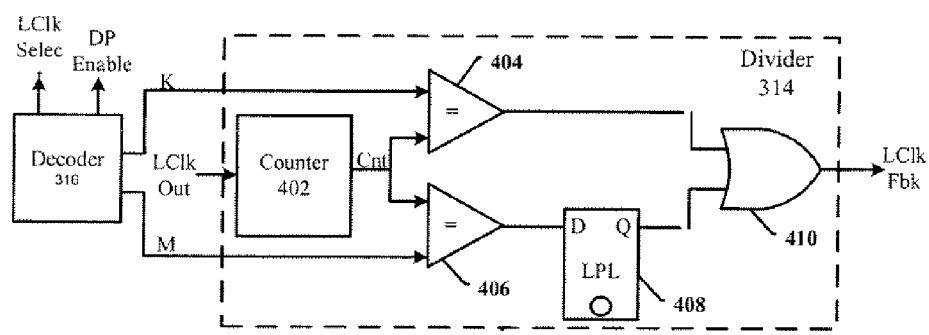
FIG. 4 is a diagram of a divider circuit in accordance with some embodiments.

FIG. 4 shows a more particular implementation of a divider 314 in accordance with some embodiments. It comprises a counter 402, count comparators 404, 406, a low-phase latch 408, and an OR gate 410, all coupled together as shown. The counter 402 is driven by the local clock output (LClk Out) signal to a count of K, which is set by the decoder 316, where it rolls over and starts counting again. The count output (Cnt) is coupled to inputs of both count comparators 404 and 406. Count comparator 404 receives a count reference K, while the other count comparator 406 receives a count reference M (both K and M coming from decoder 316). The output from the K count comparator 404 is coupled to an input of OR gate 410, while the output from the M count comparator 406 is coupled through low-phase latch 408, whose output is coupled to the other input of the OR gate 410. The latch 408 is clocked by the local clock output (LClk Out).

In operation, the counter counts to the value K, rolls over, and continues counting until once again it reaches the value K. This continues until the circuit is disabled or the value of K is changed by the decoder 316. The count comparators 404, 406 output a Low, unless the count (Cnt) is at their count reference, at which time, the comparator outputs a High for that clock cycle. Thus, the output of the OR gate 410 generates a pulse off of the falling edge of every $M^{th}$ cycle and from the rising edge of every $K^{th}$ cycle. (It is assumed that M<K.) The M count comparator 406 can be disabled (e.g., by setting M to a value greater than K or by holding the latch in reset) to generate pulses only from the K comparator 404, if desired. The decoder 316 may comprise any suitable circuit elements described so far and to be described below. For example, it could be implemented simply with logic devices or with a controller or with some other suitable means, as will be appreciated by a person of ordinary skill.

Figure 5:
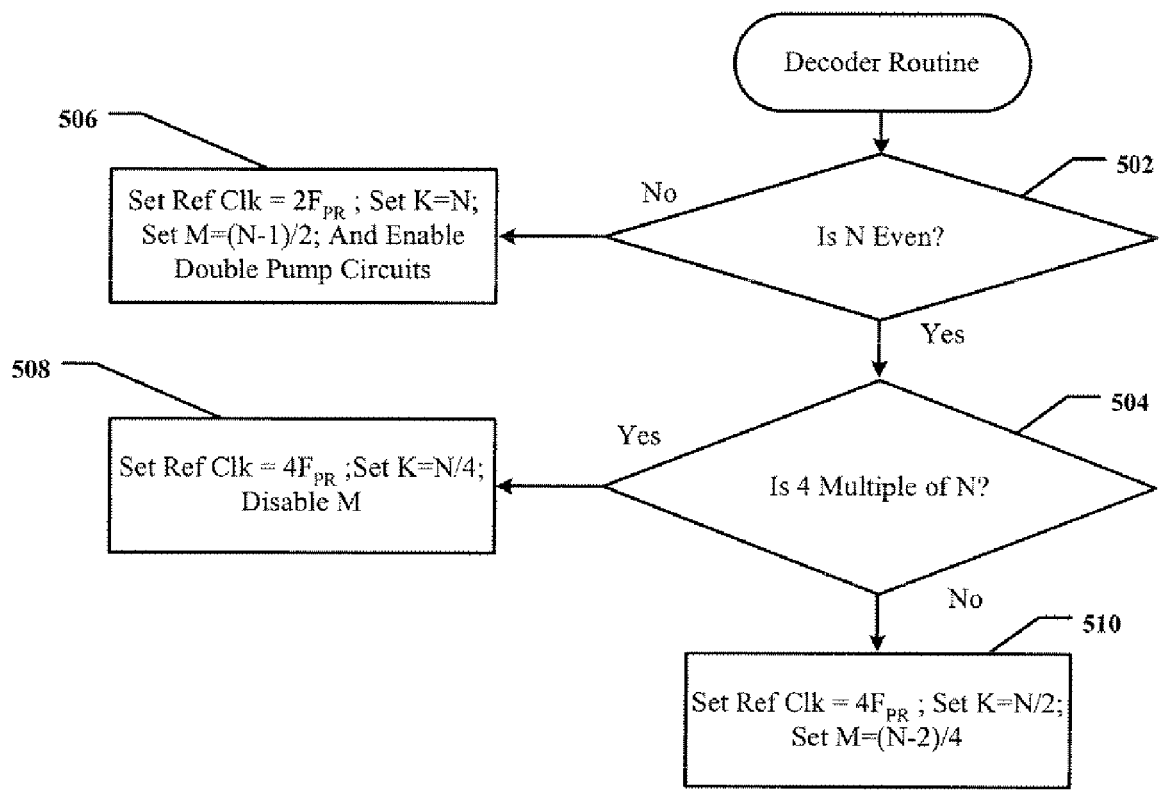
FIG. 5 is a flow diagram of a routine to implement the decoder and divider circuits of FIGS. 3 and 4 in accordance with some embodiments.

FIG. 5 shows an embodiment of a decoder routine to control a clock generator of FIGS. 3 and 4 to generate a desired local clock as defined by a ratio multiplier N. Initially, at 502, it determines if N is even. If so, then at 504, it determines if N is divisible by 4. If it is so divisible by 4, then at 508, it simply sets K equal to N/4 and disables M so that the M count comparator 406 output stays Low. It also controls the double-pump multiplexers 422, 424 so that the double pump circuits are not selected.

Figure 6:
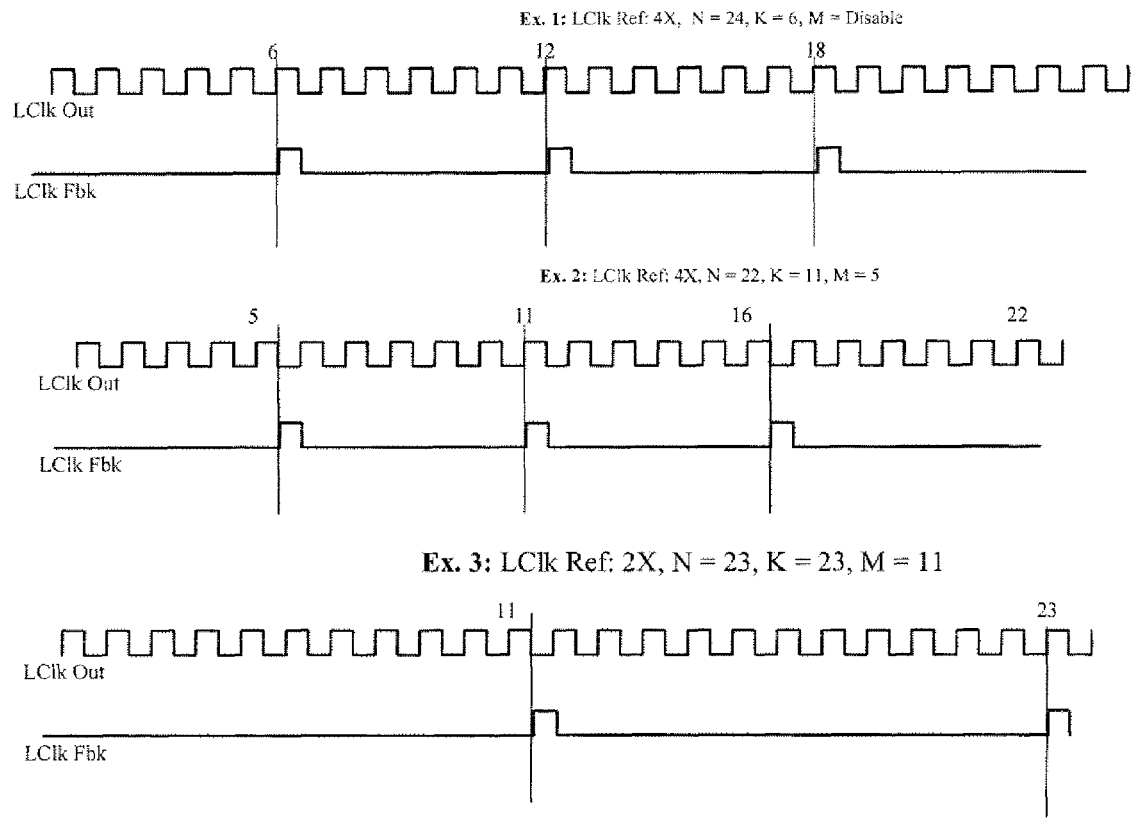
FIG. 6 is a signal diagram illustrating exemplary signals coming into and out from the divider of FIG. 4 in accordance with some embodiments of the routine of FIG. 5.

Example 1 in FIG. 6 shows LClk Out (input to divider) and LClk Fbk (output from divider) signals for this case where N=24. With N=24, K will be equal to 24/4=6. The counter 402 is thus set to repeatedly count to 6. When it reaches 6 (every sixth LClk Out cycle) the K count comparator 404 goes high, which causers the OR gate 410 to generate a pulse on the rising edge of every sixth LClk Out pulse. The OR gate output (LClk Fbk) is thus LClk Out divided by 6. This forces the local clock output (LClk Out) to be 6 times 4× or 24×, which is the desired local clock frequency.

At step 504, if N is not a multiple of 4, then at step 510, the decoder sets K equal to N/2 and sets M equal to (M−2)/4. Again, the decoder does not select (or activate) the double pump circuits. This will cause the Or gate 410 to output a pulse on the rising edge every $K^{th}$ clock cycle and halfway between these pulses (on the falling edge after every $M^{th}$ pulse). Essentially, it's the same as dividing the local clock output by K and multiplying it by 2 before passing it to the PLL as feedback, which is the same as dividing it by N/4.

Example 2 in FIG. 6 illustrates signals for this case with N equal to 22. With this example, K=11 and M=5, which causes the Or gate output (LClk Fbk) to pulse on the rising edge of every $11^{th}$ cycle and on the falling edge following every $5^{th}$ cycle. So, essentially, the local clock output is being divided by 11 and multiplied by 2 before being fedback to the PLL, which results in the local clock having a frequency of 5.5 times 4×=22×, as desired.

Returning back to FIG. 5, if it is determined at 502 that N is not even (i.e., it's odd), then at 506, the decoder selects the 2× reference clock (instead of the 4× clock), sets K equal to N, and sets M equal to (N−1)/2. It also enables the double pump circuits by selecting them in multiplexers 322, 324. This causes the OR output (LClk Fbk) to generate a pulse on the rising edge of every $K^{th}$ cycle and on the falling edge after every $M^{th}$ cycle (halfway between every K'h pulse), which is the same as dividing the local clock by K and multiplying it by 2 before feeding it back to the PLL through double pump circuit 318. As mentioned above, double pumping functions to Multiply the signal by 2, so the fedback signal is: (LClk Out/K)·2·2, or (4/K)·LClk Out. Since a double-pumped version of the 2× signal is provided to the reference input of the PLL 312, the reference acts like a 4× reference. Thus, with the PLL forcing the fedback signal to equal the reference input, (4/K)*LClk Out=4×, or LClk Out=KX=NX, the desired result is attained. (Note that a 2× reference is used instead of a 4× reference because when N is odd, dividing it by 4 essentially would require clock edges to occur between the rising and falling edges of the 4× reference.)

Example 3 in FIG. 6 illustrates signals for this case with N equal to 23. As shown, a LClk Fbk pulse is generated off the rising edge of every $23^{rd}$ cycle and off the falling edge after every $11^{th}$ cycle, which is the same as dividing the LClk Out by 23 and multiplying it by 2. With enabled double pumping, this results in the local clock frequency equal to 23×, the desired result. (note that we would have achieved this same output clock without double pumping but would have had a 2× instead of an equivalent 4× signal applied to the reference input of the PLL. As mentioned above, it's desirable in most applications to drive a PLL input at a higher frequency to achieve better response.)

Figure 7:
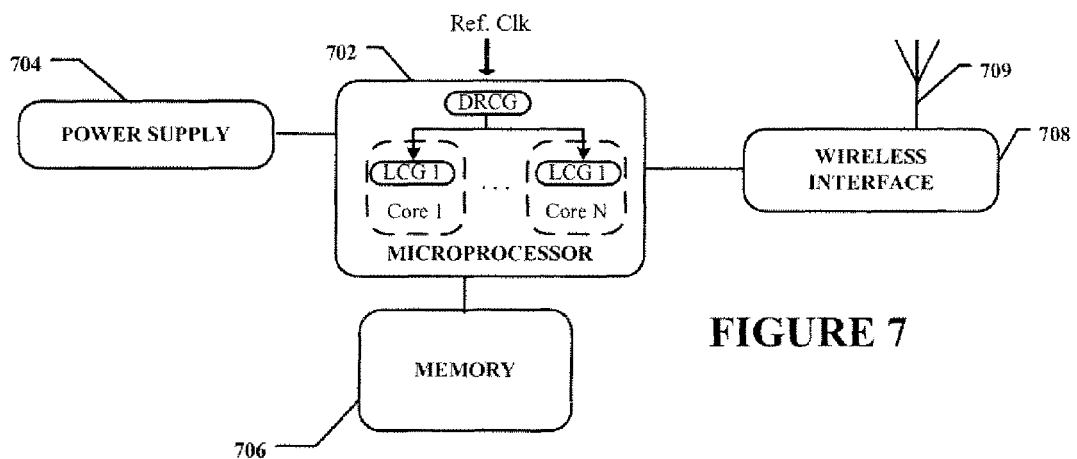
FIG. 7 is a block diagram of a computer system having a microprocessor with a clock generator system as disclosed herein.

With reference to FIG. 7, one example of a computer system is shown. The depicted system generally comprises a processor 702 that is coupled to a power supply 704, a wireless interface 708, and memory 706. It is coupled to the power supply 704 to receive from it power when in operation. The wireless interface 708 is coupled to an antenna 709 to communicatively link the processor through the wireless interface chip 708 to a wireless network (not shown). Microprocessor 702 comprises one or more clock generators such as a novel clock generator disclosed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
a clock generator comprising
a reference clock generator to generate one or more reference clocks from an applied primary reference clock; and
at least one local clock generator coupled to the reference clock generator to generate a local clock from a selected one of the one or more reference clocks, the at least one local clock generator having a PLL bandwidth greater than that of the reference clock generator, wherein the frequency of a local clock to be generated is a multiple of the primary reference clock and determined from a ratio provided to the local clock generator to generate said local clock and wherein the at least one local clock generator comprises a decoder to receive said ratio and to select one of the one or more reference clocks based on the ratio.

2. The chip of claim 1, in which the reference clock generator comprises a PLL with a low PLL bandwidth relative to the frequency of the primary reference clock to suitably filter jitter from it.

3. The chip of claim 1, in which the reference clock generator comprises a PLL to be driven at a higher frequency than any of the one or more reference clocks.

4. The chip of claim 3, in which the reference clock generator comprises a divider in a feedback path of the PLL to divide a clock output from the PLL in order to generate the one or more reference clocks.

5. The chip of claim 4, in which the divider comprises a binary counter.

6. The chip of claim 1, in which the decoder selects the highest one of the one or more reference clocks that can be divided and multiplied, if necessary, by integer values to generate the determined local clock frequency.

7. The chip of claim 6, in which the local clock generator comprises a PLL with a feedback path having a divider to divide the generated local clock, said divided local clock to be coupled to an input of said PLL.

8. The chip of claim 7, in which the divider comprises a counter to be driven by said local clock to generate a pulse every k.sup.th cycle to divide the local clock frequency by k.

9. The chip of claim 8, in which the divider comprises a circuit to generate a pulse every $m^{th}$ cycle on the opposite edge of the edge initiating the pulse every $k^{th}$ cycle to provide multiplication functionality in said divider.

10. The chip of claim 1, in which the local clock generator comprises a PLL with a reference input path and a feedback input path, said reference and feedback input paths each comprising a double pump circuit to drive said PLL at a higher frequency than otherwise would be available to provide a desired local clock frequency.

11. A method, comprising
generating one or more reference clocks with a first PLL from a primary reference clock;
filtering jitter from the primary reference clock with said first PLL;
selecting one of the one or more reference clocks to generate a desired local clock; and
generating said desired local clock with a second PLL, said second PLL having a higher PLL bandwidth than said first PLL, wherein generating the desired clock comprises dividing the local clock by a value based on the selected reference clock and on a provided ratio of said local clock to said primary reference clock.

12. The method of claim 11, in which generating the one or more reference clocks comprises dividing a clock signal output from the first PLL to overdrive said first PLL.

13. The method of claim 11, in which dividing comprises dividing and multiplying by integer values.

14. The method of claim 13, in which generating comprises double pumping the selected reference clock and providing it to an input of said second PLL.

15. A system, comprising:
(a) a microprocessor comprising a first PLL to generate one or more reference clocks from a primary reference clock and a second PLL to generate a local clock having a desired frequency from a selected one of said one or more reference clocks, the first PLL to filter jitter from the primary reference clock and the second PLL to have a higher PLL bandwidth than said first PLL to provide the local clock with suitable response, wherein the frequency of a local clock to be generated is a multiple of the primary reference clock and determined from a ratio provided to the local clock generator to generate said local clock and wherein the at least one local clock generator comprises a decoder to receive said ratio and to select one of the one or more reference clocks based on the ratio;
(b) an antenna; and
(c) a wireless interface coupled to the microprocessor and to the antenna to communicatively link the microprocessor to a wireless network.

16. The system of claim 15, in which said first PLL is driven at a higher frequency than the one or more reference clocks.

17. The system of claim 15, further comprising a battery to supply operational power to said microprocessor.

* * * * *